(12) United States Patent
Bedell et al.

(10) Patent No.: US 8,841,203 B2
(45) Date of Patent: Sep. 23, 2014

(54) METHOD FOR FORMING TWO DEVICE WAFERS FROM A SINGLE BASE SUBSTRATE UTILIZING A CONTROLLED SPALLING PROCESS

(75) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 580 days.

(21) Appl. No.: 13/159,877

(22) Filed: Jun. 14, 2011

(65) Prior Publication Data

US 2012/0322230 A1  Dec. 20, 2012

(51) Int. Cl.
*H01L 21/30* (2006.01)
*H01L 21/46* (2006.01)
*H01L 21/762* (2006.01)

(52) U.S. Cl.
USPC ............... 438/458; 257/E21.568; 257/E21.57

(58) Field of Classification Search
None
See application file for complete search history.

(56) References Cited

U.S. PATENT DOCUMENTS

| | | | |
|---|---|---|---|
| 6,326,285 B1 * | 12/2001 | Behfar et al. | 438/455 |
| 6,528,391 B1 * | 3/2003 | Henley et al. | 438/459 |
| 2001/0007790 A1 * | 7/2001 | Henley et al. | 438/514 |
| 2004/0219762 A1 * | 11/2004 | Shimoda et al. | 438/455 |
| 2007/0017438 A1 * | 1/2007 | Xie et al. | 117/95 |
| 2009/0242032 A1 * | 10/2009 | Yamazaki et al. | 136/261 |
| 2010/0311250 A1 | 12/2010 | Bedell et al. | |
| 2010/0323472 A1 * | 12/2010 | Dross et al. | 438/96 |
| 2012/0003815 A1 * | 1/2012 | Lee | 438/458 |

* cited by examiner

*Primary Examiner* — Calvin Choi
(74) *Attorney, Agent, or Firm* — Scully, Scott, Murphy & Presser, P.C.; Louis J. Percello, Esq.

(57) ABSTRACT

The present disclosure provides a method for forming two device wafers starting from a single base substrate. The method includes first providing a structure which includes a base substrate with device layers located on, or within, a topmost surface and a bottommost surface of the base substrate. The base substrate may have double side polished surfaces. The structure including the device layers is spalled in a region within the base substrate that is between the device layers. The spalling provides a first device wafer including a portion of the base substrate and one of the device layers, and a second device wafer including another portion of the base substrate and the other of the device layer.

25 Claims, 5 Drawing Sheets

METHOD FOR FORMING TWO DEVICE WAFERS FROM A SINGLE BASE SUBSTRATE UTILIZING A CONTROLLED SPALLING PROCESS

BACKGROUND

The present disclosure relates to semiconductor device manufacturing, and more particularly, to a method for forming two device wafers starting from a single base substrate.

One of the conventional methods of fabricating advanced semiconductor based devices is to epitaxially grow one or more crystalline semiconductor layers on a base substrate. The composition and doping of the epitaxially grown crystalline semiconductor layers can be controlled in order to achieve a specific electronic or opto-electronic function. Examples of the epitaxially grown crystalline semiconductor layers can be quantum well structures used for semiconductor lasers, multiple heteroepitaxial p-n junctions for use in high-efficiency photovoltaic structures, or as simple as formed p-n junctions.

Generally speaking, these highly specialized single-crystal semiconductor-containing structures are costly and time consuming to form or grow. Additionally, the single-crystal semiconductor-containing substrates themselves are relatively expensive and usually one substrate yields one device wafer. Typically, the most expensive epitaxial structures involve III-V or II-VI compound semiconductors which are generally formed using metalorgano chemical vapor deposition (MOCVD) or molecular beam epitaxy (MBE) reactors. In both cases, growth usually occurs only on one side of a base substrate. Other methods of growth that are more commonly used in Group IV crystal growth such as low pressure chemical vapor deposition (LPCVD) or ultra high vacuum chemical vapor deposition (UHVCVD) batch reactors typically grow on both sides of a base substrate. The high cost of the base substrates and the growth process severely limit the throughput and cost of forming these epitaxial layers.

SUMMARY

The present disclosure provides a method for forming two device wafers starting from a single base substrate. The method includes first providing a structure which includes a base substrate with device layers located on, or within, a topmost surface and a bottommost surface of the base substrate. The base substrate may have double side polished surfaces. The structure including the device layers is spalled within a region of the base substrate.

The spalling provides a first device wafer including a portion of the base substrate and one of the device layers, and a second device wafer including another portion of the base substrate and the other of the device layer. The advantage of the aforementioned approach is that every base substrate yields two individual device wafers and concurrently the growth throughput is doubled. Partial or complete device fabrication may be performed on the device layers prior to spalling.

DETAILED DESCRIPTION

Figure 1:
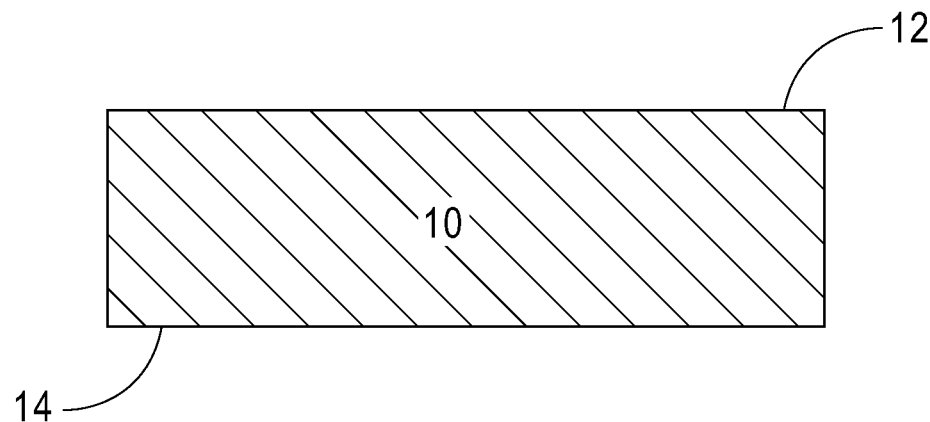
FIG. 1 is a pictorial representation (through a cross sectional view) depicting a base substrate that can be employed in one embodiment of the present disclosure.

The present disclosure, which provides a method for forming two device wafers starting from a single base substrate, will now be described in greater detail by referring to the following discussion and drawings that accompany the present application. It is noted that the drawings are provided for illustrative purposes only and are not drawn to scale. Also, in the drawings like reference are used for describing like elements.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the present disclosure provides a method for forming two device wafers starting from a single base substrate. The method includes first providing a structure which includes a base substrate with device layers located on, or within, a topmost surface and a bottommost surface of the base substrate. The structure including the device layers is spalled within a region of the base substrate. The spalling provides a first device wafer including a portion of the base substrate and one of the device layers, and a second device wafer including another portion of the base substrate and the other of the device layer.

Referring first to FIG. 1 there is illustrated a base substrate 10 having an upper (i.e., topmost) surface 12 and a lower (i.e., bottommost) surface 14 that can be employed in the present disclosure. The base substrate 10 employed in the present disclosure may comprise a semiconductor material, a glass, a ceramic, or any another material whose fracture toughness is less than that of the stressor layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single-crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single-crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, the upper surface 12 and the bottom surface 14 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the upper surface 12 and the lower surface 14 of the base substrate 10.

In another embodiment, the upper surface 12 and the lower surface 14 are both polished prior to further processing. Polishing can be achieved by chemical mechanical polishing.

Figure 2A:
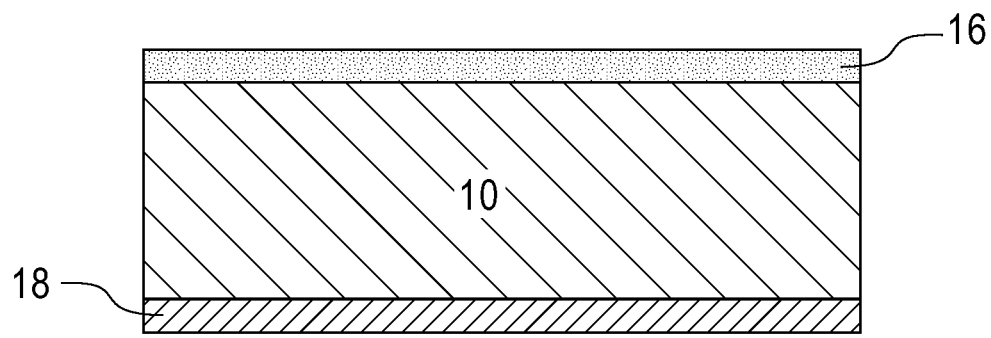
FIG. 2A is a pictorial representation (through a cross sectional view) depicting the base substrate of FIG. 1 after forming a device layer on a bottommost surface of the base substrate and after forming another device layer on a topmost surface of the base substrate.

Referring now to FIG. 2A, there is illustrated the structure of FIG. 1 after forming one device layer 18 on the lower surface 14 of the base substrate 10, and after forming another device layer 16 on the upper surface 12 of the base substrate 10 in accordance with an embodiment of the present disclosure. In some embodiments, the device layers 16, 18 that are formed provide an electrical junction (i.e., p-n or n-p) at the interface between the device layer and the base substrate 10.

In the embodiment depicted in FIG. 2A, the device layers 16, 18 can comprise the same or different semiconductor material. In one embodiment, the semiconductor material of the device layers 16, 18 can be the same as that of the base substrate 10. In another embodiment, at least one of the device layers, typically both, is comprised of a semiconductor material that is different from the base substrate 10. Examples of semiconductor materials that can be employed as the device layers 16, 18 may include, but are not limited to, Si, Ge, SiGe, SiGeC, SiC, Ge alloys, GaSb, GaP, GaAs, InAs, InP, and all other III-V or II-VI compound semiconductors.

In one embodiment, the semiconductor material that can be employed as the device layers 16, 18 can be single-crystalline (i.e., a material in which the crystal lattice of the entire sample is continuous and unbroken to the edges of the sample, with no grain boundaries). In another embodiment, the semiconductor material that can be employed as the device layers 16, 18 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the device layers 16, 18 can be amorphous (i.e., a non-crystalline material that lacks the long-range order characteristic of a crystal). Typically, the semiconductor material that can be employed as the device layers 16, 18 is a single-crystalline material.

The device layers 16, 18 that are formed upon the topmost surface (i.e., upper surface 12) and the bottommost surface (i.e., lower surface 14) of the base substrate 10 can be formed by a physical or growth deposition process in which at least a semiconductor precursor is employed. In some embodiments, a dopant such as a p-type dopant (typically an Element from Group IIIA of the Periodic Table of Element) or an n-type dopant (typically an Element from Group VA of the Periodic Table of Elements) can be included within the reactant gas including the semiconductor precursor. In yet other embodiments, the dopant can be introduced after formation of the device layers 16, 18 by ion implantation, gas phase doping or by out-diffusion from a sacrificial doped layer.

In one embodiment, the device layers 16, 18 are formed by an epitaxially growth process. When an epitixially growth process is employed, the device layers 16, 18 are epitaxially aligned with the underlying surface of base substrate 10.

In one embodiment, the device layers 16, 18 are formed one at time. That is, one of the device layers 16 or 18 is formed first, and then the other of device layers 16 or 18 is formed. In such an embodiment, the device layers 16, 18 can be formed in a MOCVD or MBE reactor. In another embodiment, layer transfer processes can be used in forming the device layers 16, 18.

In another embodiment, the device layers 16, 18 are formed simultaneously. That is, the device layers 16, 18 are formed at the same time. In such an embodiment, the device layers 16, 18 can be formed in a batch reactor such as, for example, a LPCVD or UHVCVD reactor.

In one embodiment, the device layers 16, 18 that are formed upon the topmost and bottommost surfaces of the base substrate 10 each have a thickness that is typically within a range from 50 nm to 50 μm. In another embodiment, the device layers 16, 18 that are formed upon the topmost and bottommost surfaces of the base substrate 10 each have a thickness that is typically within a range from 1 μm to 20 μm. Other thicknesses for the device layers 16, 18 that are above and/or below the aforementioned ranges can also be employed.

Figure 2B:
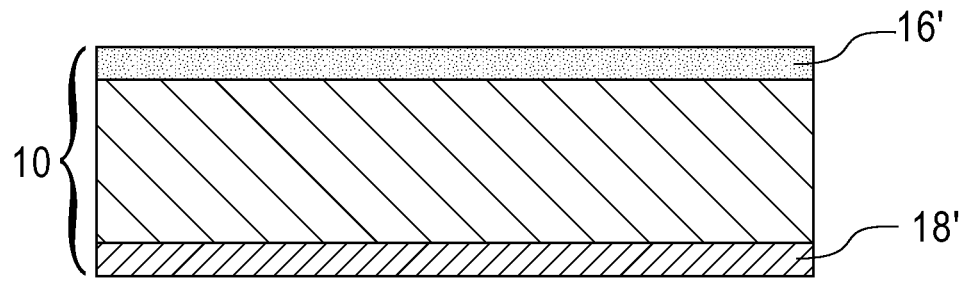
FIG. 2B is a pictorial representation (through a cross sectional view) depicting the base substrate of FIG. 1 after forming a device layer within a bottommost surface of the base substrate and after forming another device layer within a topmost surface of the base substrate.

Referring now to FIG. 2B, there is illustrated the structure of FIG. 1 after forming one device layer 18' within the lower surface 14 of the base substrate 10, and after forming another device layer 16' within the upper surface 12 of the base substrate 10 in accordance with another embodiment of the present disclosure. In the embodiment illustrated in FIG. 2B, the device layers 16' and 18' can be formed by ion implantation, gas phase doping or out-diffusion from a sacrificial doped material. In this embodiment, the device layers 16' and 18' can have the same or different dopant present therein. That is, the device layers 16' and 18' can contain a p-type dopant (i.e., an Element from Group IIIA of the Periodic Element) or an n-type dopant (i.e., an Element from Group VA of the Periodic Elements).

In either of the above mentioned embodiments, a semiconductor device including, for example, a transistor, a capacitor, a diode, a BiCMOS, can be formed partially or completely on the device layers prior to spalling the base substrate 10. In some embodiments, the device layers are components of a photovoltaic cell, such as a solar cell. In such an embodiment, other components of the solar cell can be formed on the device layers prior to spalling.

Figure 3A:
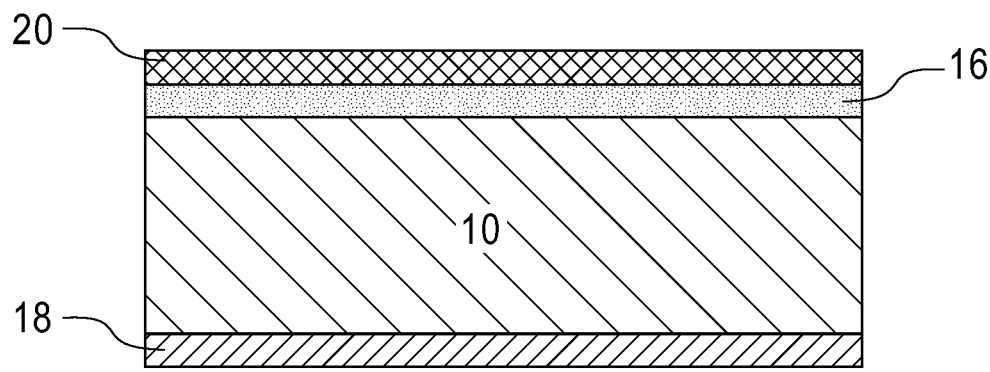
FIG. 3A is a pictorial representation (through a cross sectional view) illustrating the structure of FIG. 2A after forming an optional metal-containing adhesion layer on a surface of one of the device layers.
Figure 3B:
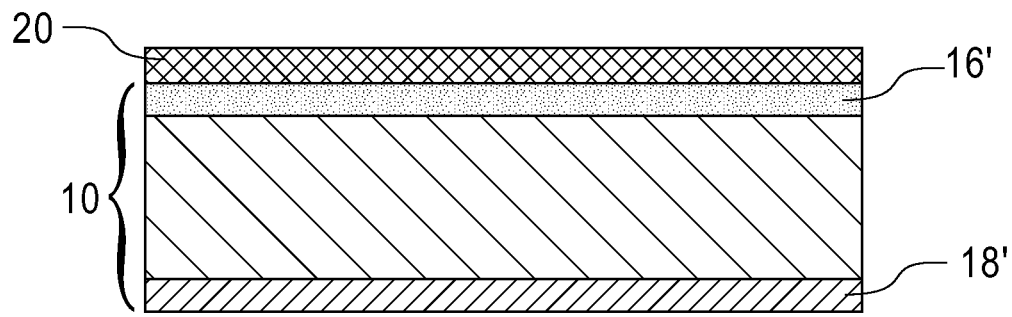
FIG. 3B is a pictorial representation (through a cross sectional view) illustrating the structure of FIG. 2B after forming an optional metal-containing adhesion layer on a surface of one of the device layers.

Referring now to FIGS. 3A-3B, there is illustrated the structure of FIG. 2A-2B, respectively, after forming an optional metal-containing adhesion layer 20 on the at least one of the device layers. In the drawings, the optional metal-containing adhesion layer 20 is formed on device layer 16 in FIG. 3A, and on device layer 16' in FIG. 3B. Although the drawings depict the optional metal-containing adhesion layer 20 being formed only on device layer 16, 16', the optional metal-containing adhesion layer 20 can, in another embodiment, be formed only on device layer 18, 18'. In yet another embodiment, the optional metal-containing adhesion layer 20 can be formed on both device layers 16 and 18 in the structure shown in FIG. 2A or on both device layers 16' and 18' shown in FIG. 2B.

The optional metal-containing adhesion layer 20 can be employed in embodiments in which the stressor layer to be subsequently formed has poor adhesion to the material of the device layers. Typically, the optional metal-containing adhesion layer 20 is employed when a stressor layer comprised of a metal is employed.

The optional metal-containing adhesion layer 20 employed in the present disclosure includes any metal adhesion material such as, but not limited to, Ti/W, Ti, Cr, Ni or any combination thereof. The optional metal-containing adhesion layer 20 may comprise a single layer or it may include a multilayered structure comprising at least two layers of different metal adhesion materials.

The optional metal-containing adhesion layer 20 that can be formed at room temperature (15° C.-40° C.) or above. In one embodiment, the optional metal-containing adhesion layer 20 is formed at a temperature which is from 20° C. to 180° C. In another embodiment, the optional metal-containing adhesion layer 20 is formed at a temperature which is from 20° C. to 60° C.

The optional metal-containing adhesion layer 20 can be formed utilizing deposition techniques that are well known to those skilled in the art. For example, the optional metal-containing adhesion layer 20 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition. In embodiments when the optional metal-containing adhesion layer is present on both the device layers (i.e., layers 16 and 18 or, layers 16' and 18'), the optional metal-containing adhesion layer can be formed on one of the device layers first, and then formed on the other device layer, or the optional metal-containing adhesion layer can be formed on both the device layers at the same time.

When employed, the optional metal-containing adhesion layer 20 typically has a thickness of from 5 nm to 200 nm, with a thickness of from 100 nm to 150 nm being more typical. Other thicknesses for the optional metal-containing adhesion layer 20 that are below and/or above the aforementioned thickness ranges can also be employed in the present disclosure.

Figure 4A:
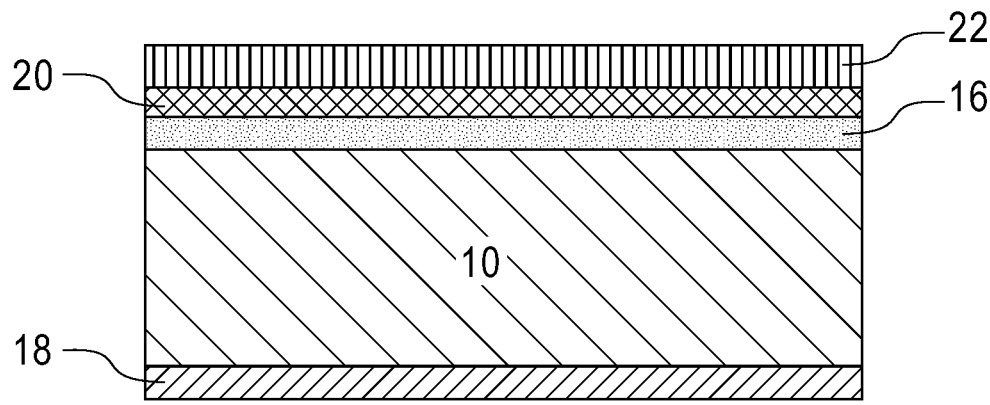
FIG. 4A is a pictorial representation (through a cross sectional view) illustrating the structure of FIG. 3A after forming a stressor layer on a surface of the optional metal-containing adhesion layer.
Figure 4B:
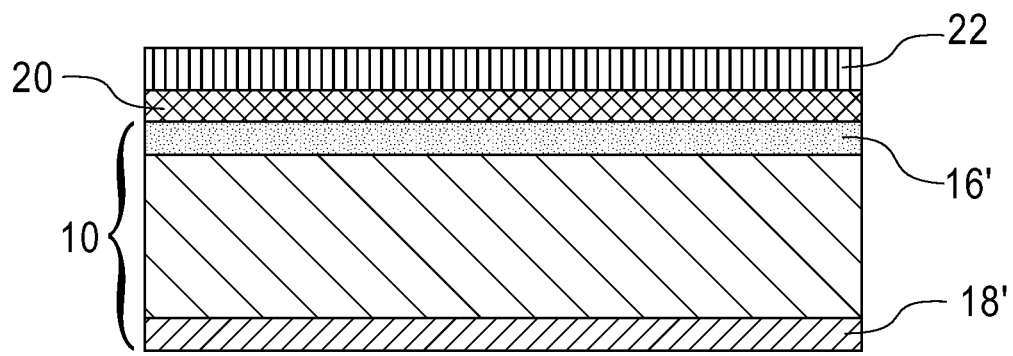
FIG. 4B is a pictorial representation (through a cross sectional view) illustrating the structure of FIG. 3BA after forming a stressor layer on a surface of the optional metal-containing adhesion layer.

Referring now to FIGS. 4A-4B, there is illustrated the structure of FIGS. 3A-3B, respectively after forming a stressor layer 22 on an upper surface of the optional metal-containing adhesion layer 20. In some embodiments in which the optional metal-containing adhesion layer 20 is not present, the stressor layer 22 can be formed directly on the upper surface 12 and/or the lower surface 14 of base substrate 10; these particular embodiments are not shown in the drawings, but can readily be deduced from the drawings illustrated in the present application.

The stressor layer 22 employed in the present disclosure includes any material that is under tensile stress while present atop base substrate 10 at the spalling temperature. Illustrative examples of such materials that can be employed as the stressor layer 22 include, but are not limited to, a metal, a polymer, such as a spall inducing tape layer, or any combination thereof. The stressor layer 22 may comprise a single stressor layer, or a multilayered stressor structure including at least two layers of different stressor material can be employed.

In one embodiment, the stressor layer 22 is a metal, and the metal is formed on an upper surface of the optional metal-containing adhesion layer 20. In another embodiment, the stressor layer 20 is a spall inducing tape, and the spall inducing tape is applied directly to at least one of the surfaces (i.e., upper and/or lower) of the base substrate 10. In another embodiment, for example, the stressor layer 22 may comprise a two-part stressor layer including a lower part and an upper part. The upper part of the two-part stressor layer can be comprised of a spall inducing tape layer.

When a metal is employed as the stressor layer 22, the metal can include, for example, Ni, Cr, Fe or W. Alloys of these metals can also be employed. In one embodiment, the stressor layer 22 includes at least one layer consisting of Ni.

When a polymer is employed as the stressor layer 22, the polymer is a large macromolecule composed of repeating structural units. These subunits are typically connected by covalent chemical bonds. Illustrative examples of polymers that can be employed as the stressor layer 22 include, but are not limited to, polyimides, polyesters, polyolefins, polyacrylates, polyurethane, polyvinyl acetate, and polyvinyl chloride.

When a spall inducing tape layer is employed as the stressor layer 22, the spall inducing tape layer includes any pressure sensitive tape that is flexible, soft, and stress free at the temperature used to form the tape, yet strong, ductile and tensile at the temperature used during spalling. By "pressure sensitive tape," it is meant an adhesive tape that will stick with application of pressure, without the need for solvent, heat, or water for activation. Tensile stress in the tape at the spalling temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer 22 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 22 employed in the present disclosure is formed at a temperature which is at room temperature (15° C.-40° C.). In another embodiment, when a tape layer is employed, the tape layer can be formed at a temperature which is from 15° C. to 60° C.

When the stressor layer 22 is a metal or polymer, the stressor layer 22 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 22 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 22 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on a surface of a base substrate, wherein a lower part of the two-part stressor layer is formed at a first temperature which is at room temperature or slight above (e.g., from 15° C. to 60° C.), wherein an upper part of the two-part stressor layer comprises a spall inducing tape layer formed at an auxiliary temperature which is at room temperature.

If the stressor layer 22 is of a metallic nature, it typically has a thickness of from 3 μm to 50 μm, with a thickness of from 4 μm to 8 μm being more typical. Other thicknesses for a metallic stressor layer that are below and/or above the aforementioned thickness ranges can also be employed in the present disclosure. The thickness of the stressor layer 22 may be chosen to provide the desired fracture depth within the base substrate 10. For example, if the stressor layer 22 is chosen to be Ni, then fracture will occur at a depth below the stressor layer roughly 2 to 3 times the Ni thickness. The stress value for the stressor layer 22 is then chosen to satisfy the critical condition for spalling mode fracture. This can be estimated by inverting the empirical equation given by $t^*=\{(2.5\times10^6(K_{IC}^{3/2})]/\sigma^2$, where $t^*$ is the critical stressor layer thickness (in microns), $K_{IC}$ is the fracture toughness (in units of $MPa \cdot m^{1/2}$) of the base substrate 10 and $\sigma$ is the stress value of the stressor layer (in MPa or megapascals).

If the stressor layer 22 is of a polymeric nature, it typically has a thickness of from 10 μm to 200 μm, with a thickness of from 50 μm to 100 μm being more typical. Other thicknesses for a polymeric stressor layer that are below and/or above the aforementioned thickness ranges can also be employed in the present disclosure.

Figure 5A:
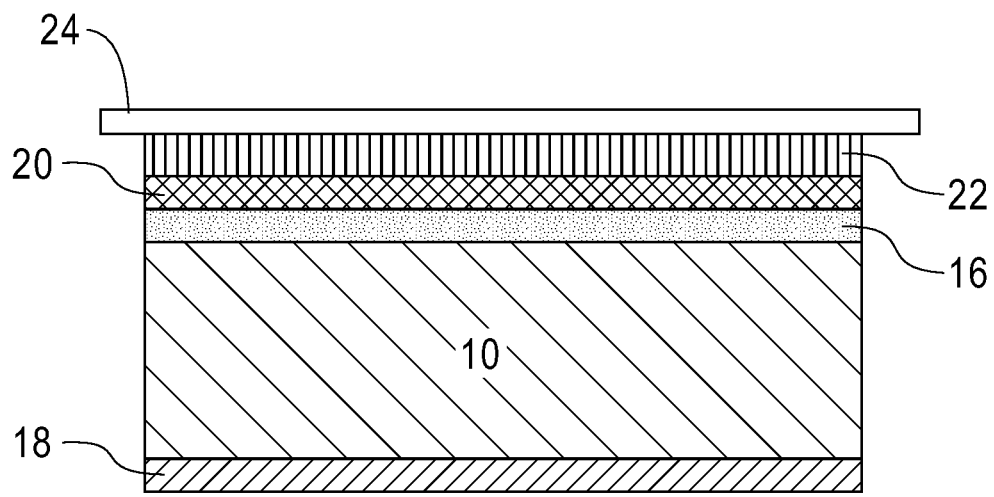
FIG. 5A is a pictorial representation (through a cross sectional view) illustrating the structure of FIG. 4A after forming an optional handle substrate on the stressor layer.
Figure 5B:
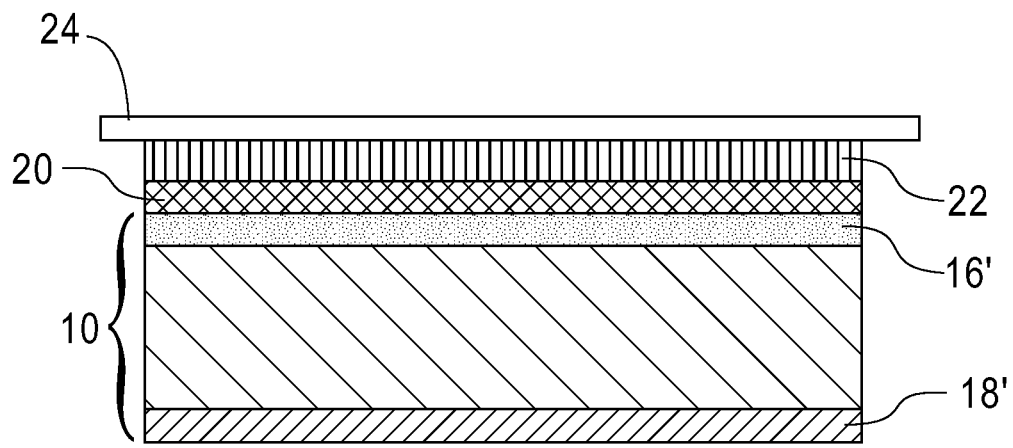
FIG. 5B is a pictorial representation (through a cross sectional view) illustrating the structure of FIG. 4B after forming an optional handle substrate on the stressor layer.

Referring to FIGS. 5A-5B, there are illustrated the structure of FIGS. 4A-4B, respectively, after forming an optional handle substrate 24 atop the stressor layer 22. The optional handle substrate 24 employed in the present disclosure comprises any flexible material which has a minimum radius of curvature of less than 30 cm. Illustrative examples of flexible materials that can be employed as the optional handle substrate 24 include a metal foil or a polyimide foil.

The optional handle substrate 24 can be used to provide better fracture control and more versatility in handling the spalled portion of the base substrate 10. Moreover, the optional handle substrate 24 can be used to guide the crack propagation during the spalling process of the present disclosure. The optional handle substrate 24 of the present disclosure is typically, but not necessarily, formed at room temperature (15° C.-40° C.).

The optional handle substrate 24 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. In some embodiments, the optional handle substrate 24 can be a UV-releasable or thermally releasable tape, a polyimide based tape, or other adhesive tapes.

The optional handle substrate 24 typical has a thickness of from 10 μm to few mm, with a thickness of from 50 μm to 120 μm being more typical. Other thicknesses for the optional handle substrate 24 that are below and/or above the aforementioned thickness ranges can also be employed in the present disclosure.

Figure 6A:
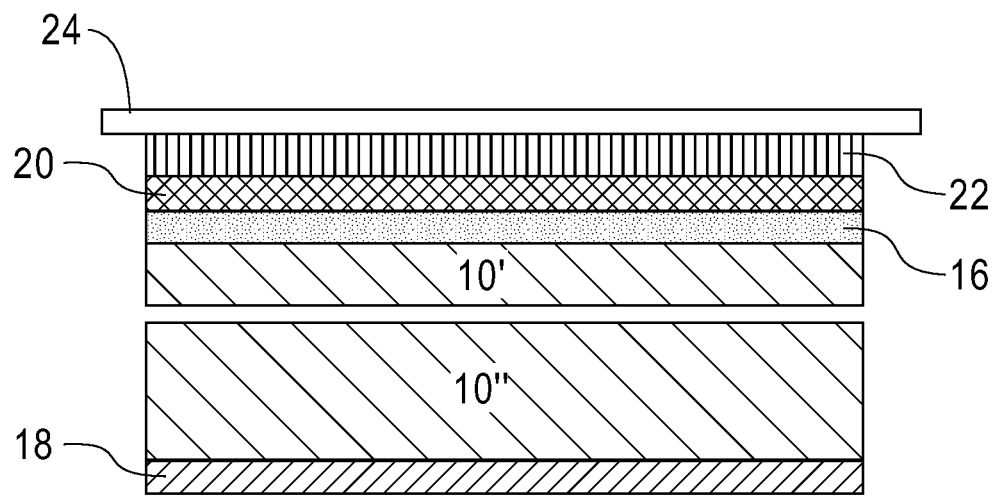
FIG. 6A is a pictorial representation (through a cross sectional view) illustrating the structure of FIG. 5A after spalling.
Figure 6B:
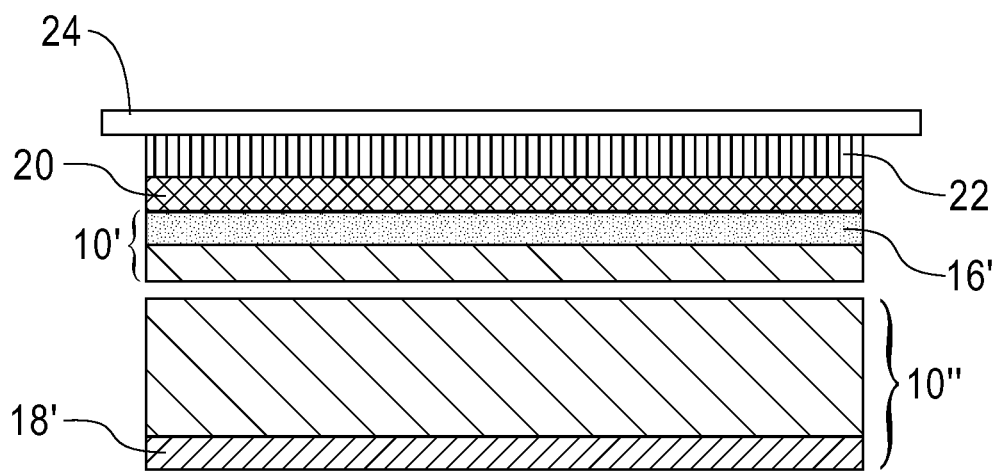
FIG. 6B is a pictorial representation (through a cross sectional view) illustrating the structure of FIG. 5B after spalling.

Referring to FIGS. 6A-6B, there is illustrated the structure of FIGS. 5A-5B, respectively, after performing a controlled spalling process. By "controlled spalling process" it is meant that crack formation, propagation and cleaving occur within a region of base substrate 10. In the drawings, the spalling process provides a first device wafer which includes a first portion 10' of base substrate 10 and device layer 16, and a second device wafer which includes a second portion 10" of base substrate 10 and device layer 18.

The controlled spalling process includes crack formation and propagation which are initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structures are returned to room temperature by allowing the spalled structures to slowly cool up to room temperature by allowing the same to stand at room temperature. Alternatively, the spalled structures can be heated up to room temperature utilizing any heating means.

Figure 7A:
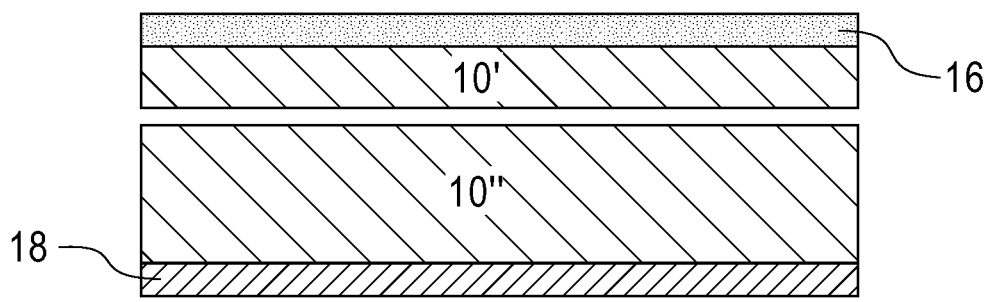
FIG. 7A is a pictorial representation (through a cross sectional view) illustrating the structure of FIG. 6A after removing the optional handle substrate, stressor layer and optional metal-containing adhesion layer.
Figure 7B:
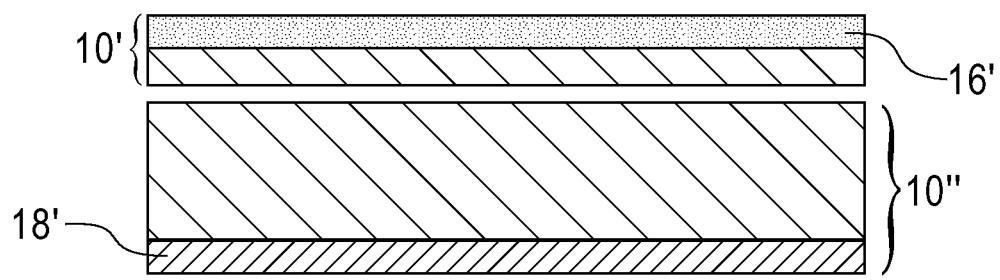
FIG. 7B is a pictorial representation (through a cross sectional view) illustrating the structure of FIG. 7B after removing the optional handle substrate, stressor layer and optional metal-containing adhesion layer.

In some embodiments of the present disclosure and as shown in FIGS. 7A-7B, the optional handle substrate 24, the stressor layer 22 and the optional metal-containing adhesion layer 20 can be removed from the first device wafer (i.e., the first portion 10' of base substrate 10 and the device layer 16). When the optional handle substrate 24, stressor layer 22 and the optional metal-containing adhesion layer 14 are removed from the first device wafer, the removal of those layers can be achieved utilizing conventional techniques well known to those skilled in the art. For example, and in one embodiment, aqua regia (HNO$_3$/HCl) can be used for removing the optional handle substrate 24, the stressor layer 22 and the optional metal-containing adhesion layer 20 from the first device wafer. In another example, UV or heat treatment is used to remove the optional handle substrate 24, followed by a chemical etch to remove the stressor layer 22, followed by a different chemical etch to remove the optional metal-containing adhesion layer 20.

As described and illustrated, the method of the present disclosure provides two device wafers from a single base substrate. The method of the present disclosure thus increases the number of device wafers that can be formed as compared to conventional techniques in which spalling is not employed.

Figure 8:
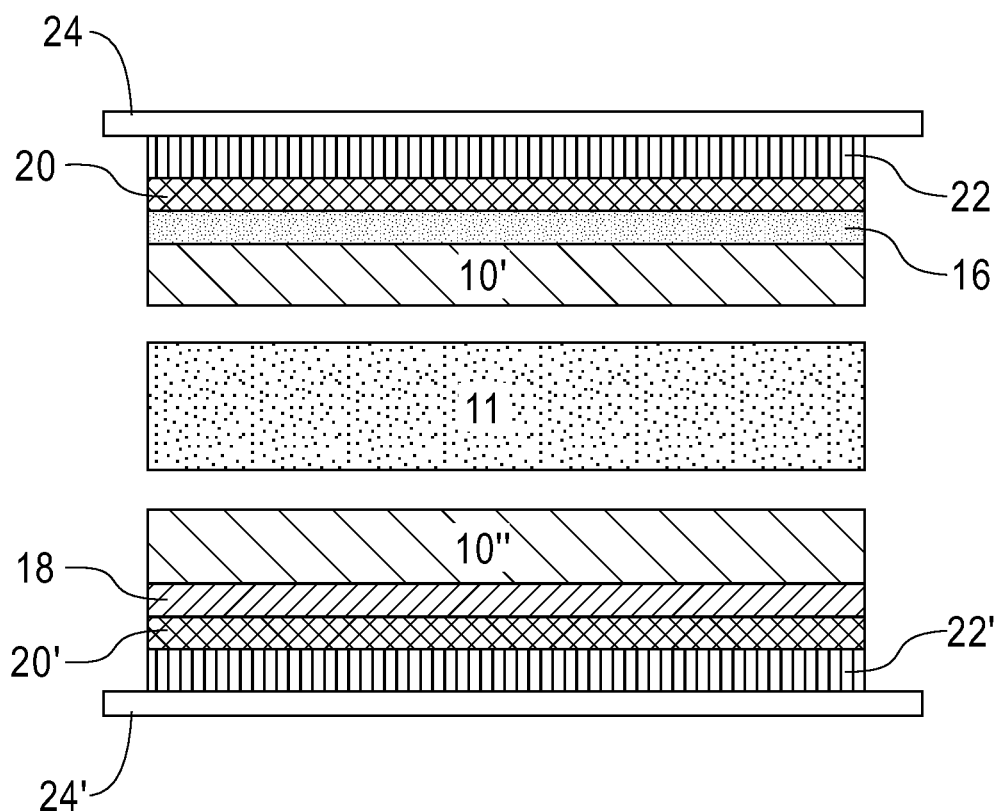
FIG. 8 is a pictorial representation (through a cross sectional view) illustrating an exemplary structure that can be formed in an embodiment in which stressor layers are present on both sides of a structure including a base substrate and top and bottom device layers.

FIG. 8 shows an exemplary structure that can be formed in an embodiment in which optional metal-containing adhesion layer 14, 14', stressor layers 22, 22' and optional handle substrates 24, 24' are present on both sides of a structure including a base substrate 10 and top and bottom device layers (i.e., layers 16 and 18, respectively). The structure shown in FIG. 8 is made using the basic processing steps mentioned above. In this embodiment, a portion 11 of the original base substrate 10 remains after the cleaving step. This embodiment also forms a first device wafer including a first portion 10' of base substrate 10 and device layer 16, and a second device wafer including a second portion 10" of base substrate 10 and device layer 18.

In the embodiment illustrated in FIG. 8, the optional metal-containing adhesion layer 14, 14', stressor layers 22, 22' and optional handle substrates 24, 24' can be composed of the same or different material. Also, optional metal-containing adhesion layer 14, 14', stressor layers 22, 22' and optional handle substrates 24, 24' can be formed utilizing a same or different technique.

This embodiment of the present disclosure also provides two device wafers from a single base substrate, as well as remaining portion 11 of a base substrate which can be reused as deemed necessary. The method of the present disclosure thus increased the number of device wafers that can be formed as compared to conventional techniques in which spalling is not employed.

The present disclosure can be used in fabricating various types of thin-film devices including, but not limited to, semiconductor devices, and photovoltaic devices.

In some embodiments of the present disclosure, the stressor layer 22, 22' is located only atop a portion of the base substrate 10. In such an embodiment, the stressor layer 22, 22' can be first formed as described above and then patterned. In some embodiments, patterning can be achieved by lithography and etching. In this particular aspect, the spalling method described above can be used to spall only a portion of the base substrate and the device layer in which the patterned stressor layer is located thereon. This alternative embodiment of the present disclosure can be used to spall off chiplets (i.e., CMOS devices) or individual solar cells from a wafer.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming two device wafers using a single base substrate, said method comprising:
   providing a base substrate of unitary construction and of uniform material composition, wherein said uniform material composition is selected from the group consisting of a ceramic, a glass and a semiconductor material;
   depositing a first device layer directly on a topmost surface of the base substrate and a second device layer directly on a bottommost surface of the base substrate, wherein said first and second device layers each comprise a semiconductor material; and
   spalling the base substrate at room temperature or a temperature below room temperature and in a region of said base substrate and between the first and second device layers, wherein said spalling provides a first device wafer including a portion of the base substrate and the first device layer, and a second device wafer including another portion of the base substrate and the second device layer.

2. The method of claim 1, wherein said depositing said first and second device layers comprises a physical or growth deposition process.

3. The method of claim 2, wherein said first and second device layers are formed one at time.

4. The method of claim 3, wherein said first and second device layers are comprised of a same semiconductor material.

5. The method of claim 3, wherein said first and second device layers are comprised of different semiconductor materials.

6. The method of claim 2, wherein said first and second device layers are formed simultaneously and are comprised of the same semiconductor material.

7. The method of claim 1, wherein said first and second device layers are comprised of a single-crystalline semiconductor material.

8. The method of claim 1, wherein said first and second device layers are comprised of an amorphous semiconductor material.

9. The method of claim 1, wherein said first and second device layers are comprised of a polycrystalline semiconductor material.

10. The method of claim 1, wherein said spalling comprises forming at least a tensile stressor layer atop, or directly on, at least one of the device layers, and cleaving the base substrate.

11. The method of claim 10, further comprises forming a metal-containing adhesion layer between the at least one device layer and said tensile stressor layer.

12. The method of claim 11, wherein said tensile stressor layer is a metal selected from Ni, Cr, Fe, W and alloy thereof, and wherein said metal-containing adhesion layer is selected from Ti/W, Ti, Cr, Ni or any combination thereof.

13. The method of claim 10, wherein said tensile stressor layer is selected from a metal, a polymer or any combination thereof.

14. The method of claim 13, wherein said tensile stressor layer is a metal and said metal is selected from Ni, Cr, Fe, W and alloy thereof.

15. The method of claim 13, wherein said tensile stressor layer is a polymer and said polymer is selected from a polyimide, a polyester, a polyolefin, a polyacrylate, polyurethane, polyvinyl acetate, and polyvinyl chloride.

16. The method of claim 15, wherein said polymer is a spalling inducing tape.

17. The method of claim 10, further comprising forming a handle substrate on the tensile stressor layer.

18. The method of claim 10, wherein said temperature below room is a temperature of 77K or less.

19. The method of claim 1, wherein said spalling comprises forming at least a first tensile stressor layer on one of the device layers, and forming at least a second tensile stressor layer on the other device layers.

20. The method of claim 19, further comprising forming a first metal-containing adhesion layer between the first tensile stressor layer and said one of the device layers, and forming a second metal-containing adhesion layer between the second tensile stressor layer and said other device layers.

21. The method of claim 19, further comprising forming a first handle substrate on the first tensile stressor layer and forming a second handle substrate on the second tensile stressor layer.

22. The method of claim 19, wherein said spalling further provides a remaining bare portion of the base substrate.

23. The method of claim 1, wherein a semiconductor device is formed partially or completely on each device layer prior to said spalling.

24. The method of claim 1, wherein said base substrate is a material whose fracture toughness is less than that of the tensile stressor layer.

25. A method of forming two device wafers using a single base substrate, said method comprising.,
    providing a structure which includes a base substrate of unitary construction and having a uniform semiconductor material composition;
    forming a first device layer within a topmost surface of the base substrate and a second device layer within a bottommost surface of the base substrate, wherein said forming said first and second device layers comprise introducing a p-type or n-type dopant into said base substrate by ion implantation, gas phase doping or by out-diffusion from a sacrificial doped layer; and
    spalling the base substrate at room temperature or a temperature below room temperature and in a region in the base substrate and between the device layers, wherein said spalling provides a first device wafer including a portion of the base substrate and the first device layer, and a second device wafer including another portion of the base substrate and the second device layer.

* * * * *